US012693718B2

(12) United States Patent
Lee

(10) Patent No.: US 12,693,718 B2
(45) Date of Patent: Jul. 28, 2026

(54) MODULARIZED AND EXPANDABLE COMPUTER SYSTEM

(71) Applicant: LANNER ELECTRONICS INC., New Taipei City (TW)

(72) Inventor: Rui-Xuan Lee, New Taipei City (TW)

(73) Assignee: LANNER ELECTRONICS INC., New Taipei (TW)

( * ) Notice: Subject to any disclaimer, the term of this patent is extended or adjusted under 35 U.S.C. 154(b) by 292 days.

(21) Appl. No.: 18/642,093

(22) Filed: Apr. 22, 2024

(65) Prior Publication Data

US 2025/0251761 A1 Aug. 7, 2025

(30) Foreign Application Priority Data

Feb. 6, 2024 (TW) ................................. 113104740

(51) Int. Cl.
*H05K 7/20* (2006.01)
*G06F 1/18* (2006.01)

(52) U.S. Cl.
CPC ........... *G06F 1/181* (2013.01); *H05K 7/2039* (2013.01)

(58) Field of Classification Search
CPC .............................. H05K 7/2039; G06F 1/181
See application file for complete search history.

(56) References Cited

U.S. PATENT DOCUMENTS 5,602,721 A * 2/1997 Slade ........................ G06F 1/18
206/509
7,529,096 B2 * 5/2009 Lin ........................... G06F 1/18
312/223.2

11,662,791 B2 * 5/2023 Exoo .......................... G06F 1/30
361/679.46
2003/0007321 A1 * 1/2003 Dayley ................ H05K 7/1435
361/679.6
2022/0269320 A1 * 8/2022 Chien .................. H05K 5/0073

FOREIGN PATENT DOCUMENTS

CN 112654316 A * 4/2021 ........... A61B 17/072

OTHER PUBLICATIONS

CN 112654316 A English translation (Year: 2021).*

* cited by examiner

*Primary Examiner* — Mukundbhai G Patel

(57) ABSTRACT

A modularized and expandable computer system is disclosed, which comprises a host electronic device, a first expansion electronic device, a second expansion electronic device, and a third expansion electronic device, wherein the first expansion electronic device has a plurality of storage modules, the second expansion electronic device has a plurality of expansion card modules, and the third expansion electronic device has a plurality of power supply units (PSUs). Moreover, the host electronic device is in communication with the first expansion electronic device and the second expansion electronic device, and the third expansion electronic device generates electric power that is further transmitted to the second expansion electronic device, and then the second expansion electronic device further transmits the electric power to the host electronic device, thereby making the first expansion electronic device receive the electric power thorough the host electronic device.

9 Claims, 16 Drawing Sheets

MODULARIZED AND EXPANDABLE COMPUTER SYSTEM

CROSS-REFERENCE TO RELATED APPLICATION

This application claims the priority of Taiwan Patent Application No. 113104740, filed on Feb. 6, 2024, the content of which is incorporated by reference in its entirety.

TECHNICAL FIELD

The present invention relates to the technology field of industrial computers, and more particularly to a modularized and expandable computer system.

BACKGROUND

It is well known that there are proposed various industrial computers, such as server, Ethernet switch, router, gateway, network attached storage (NAS) device, embedded computer, and home video game console. Engineers skilled in development and manufacture of industrial computer certainly know that, it is easy to make an industrial computer to perform a new and specific function by additionally disposing an expansion card on a motherboard thereof.

However, using expansion cards to extend industrial computer's function is unable to satisfy with the market requirements with increasing demand for AI image processing and cloud computing. Specifically, in case of the fact that a user connects a GPU card to a PCIe slot of a mother board of an industrial computer for the purpose of AI image processing, if necessary, the user must further integrate at least one storage device (e.g., HDD or SSD) into the industrial computer, and/or replace the power supply of the industrial computer with a new one with higher power. It is worth noting that, U (abbreviation for unit) is a unit that represents the external dimensions of a modular rack. The detailed dimensions are determined by the Electronic Industries Alliance (EIA), an industry group. As explained in more detail below, among the rack server sizes, the common ones are of 1U server, 2U server, and 4U server, in which the sizes of these servers are: 1U=1.75 inches, 2U=3.5 inches, and 4U=7 inches. In other words, a total number of the PCIe expansion cards capable of being added into an industrial computer is limited by the rack size.

For above reasons, to develop a new computer system including modularized host electronic device, storage device, expansion card device, and power supply device is worthy of consideration, such that it is allowable for a user to flexibly apply operations including adding of electronic modules, removal of electronic modules and repair of electronic modules to any one of the modularized host electronic device, storage device, expansion card device, and power supply device. Accordingly, inventors of the present application have made great efforts to make inventive research and eventually provided a flexible and intuitive system for configuring an automated visual inspection system.

SUMMARY

The primary objective of the present invention is to provide a modularized and expandable computer system, which comprises a host electronic device, a first expansion electronic device, a second expansion electronic device, and a third expansion electronic device, wherein the first expansion electronic device has a plurality of storage modules, the second expansion electronic device has a plurality of expansion card modules, and the third expansion electronic device has a plurality of power supply units (PSUs). Moreover, the host electronic device is in communication with the first expansion electronic device and the second expansion electronic device, and the third expansion electronic device generates electric power that is further transmitted to the second expansion electronic device, and then the second expansion electronic device further transmits the electric power to the host electronic device, thereby making the first expansion electronic device receive the electric power thorough the host electronic device.

By such particular arrangements, it is allowable for a user to apply any one of a plurality of operations to the modularized and expandable computer system, and the plurality of operations are summarized as follows:

- (1) taking measures of adding, removal or repair of storage modules (e.g., HDD or SSD) or electronic components to the first expansion electronic device;
- (2) taking measures of adding, removal or repair of expansion card modules (e.g., GPU card or QNAP Fibre Channel Expansion Card) or electronic components to the second expansion electronic device; and
- (3) taking measures of adding, removal or repair of power supply units (PSUs) or electronic components to the third expansion electronic device.

For achieving the primary objective mentioned above, the present invention provides an embodiment of the modularized and expandable computer system, comprising:

a host electronic device, comprising:

a first housing case accommodating a plurality of first electronic components, at least one first transmission interface and at least one second transmission interface;

a plurality of first guiding holes formed on a bottom surface of the first housing case;

a plurality of first screw holes formed on the bottom surface of the first housing case;

at least one first interface exposing opening, being formed on the bottom surface of the first housing case such that the at least one first transmission interface is exposed out of the first housing case through the at least one first interface exposing opening; and at least one second interface exposing opening, being formed on the bottom surface of the first housing case such that the at least one second transmission interface is exposed out of the first housing case through the at least one second interface exposing opening;

a first expansion electronic device, comprising:

a second housing case accommodating a plurality of second electronic components and at least one third transmission interface;

a plurality of first guiding rods, being disposed on a bottom surface of the second housing case, so as to be correspondingly inserted in the plurality of first guiding holes while the bottom surface of the second housing case is close to the bottom surface of the first housing case;

a plurality of second screw holes, being formed on the bottom surface of the second housing case, wherein the bottom surface of the second housing case closely contacts the bottom surface of the first housing case after a plurality of first fastening members are arranged to pass through the plurality of second screw holes and the plurality of first screw holes;

at least one third interface exposing opening, being formed on the bottom surface of the second housing case such that the at least one third transmission interface is exposed out of the second housing case through the at least one third interface exposing opening so as to be connected to the at least one first transmission interface;

at least one fourth interface exposing opening formed on the bottom surface of the second housing case;

a plurality of third screw holes formed on a top surface of the second housing case;

and a plurality of second guiding holes formed on the top surface of the second housing case;

a second expansion electronic device, comprising:

a third housing case accommodating a plurality of third electronic components, at least one fourth transmission interface and at least one fifth transmission interface;

a plurality of second guiding rods, being formed on a first side surface of the third housing case, so as to be correspondingly inserted in the plurality of second guiding holes while the first side surface of the third housing case is close to the top surface of the second housing case;

a plurality of fourth screw holes, being formed on the first side surface of the third housing case, wherein the first side surface of the third housing case closely contacts the top surface of the second housing case after a plurality of second fastening members are arranged to pass through the plurality of fourth screw holes and the plurality of third screw holes;

at least one fifth interface exposing opening, being formed on the first side surface of the third housing case such that the at least one fourth transmission interface is exposed out of the third housing case through the at least one fifth interface exposing opening so as to be connected to the at least one second transmission interface via the at least one fourth interface exposing opening of the second housing case;

at least one sixth interface exposing opening, being formed on a second side surface of the third housing case, wherein the second side surface is opposite to the first side surface;

a plurality of fifth screw holes formed on the second side surface of the third housing case; and a plurality of third guiding holes formed on the second side surface of the third housing case; and a third expansion electronic device, comprising:

a fourth housing case accommodating a plurality of fourth electronic components and at least one six transmission interface;

a plurality of third guiding rods, being disposed on one side surface of the fourth housing case, so as to be correspondingly inserted in the plurality of third guiding holes while the second side surface of the third housing case is close to the side surface of the fourth housing case;

a plurality of sixth screw holes, being formed on the side surface of the fourth housing case, wherein the second side surface of the third housing case closely contacts the side surface of the fourth housing case after a plurality of third fastening members are arranged to pass through the plurality of sixth screw holes and the plurality of fifth screw holes; and at least one seventh interface exposing opening, being formed on the side surface of the fourth housing case such that the at least one sixth transmission interface is exposed out of the fourth housing case through the at least one seventh interface exposing opening so as to be connected to the at least one fifth transmission interface via the at least one six interface exposing opening of the third housing case.

In one embodiment, the host electronic device comprises:

a first base having a first opening, wherein the plurality of first guiding holes, the plurality of first screw holes, the at least one first interface exposing opening, and the second interface exposing opening are formed on a bottom of the first base;

a first cover member, being provided with a heat dissipation structure on a top surface thereof, and being connected to the first base so as to form the first housing case;

at least one first circuit board, being disposed in the first base through the first opening, wherein the plurality of first electronic components, the at least one first transmission interface and the at least one second transmission interface are disposed on the first circuit board;

at least one electronic chip, being disposed on the first circuit board, thereby being electrically connecting to the at least one first transmission interface and the at least one second transmission interface; and at least one thermal dissipation block connected between a bottom surface of the first cover member and the at least one electronic chip.

In one embodiment, the top surface of the second housing case has a second opening, a front side surface of the second housing case is formed with a plurality of first front openings, and the first expansion electronic device further comprises:

at least one second circuit board, being disposed in the second housing case, wherein the plurality of second electronic components and the at least one third transmission interface are disposed on the at least one second circuit board;

a plurality of first electrical connectors disposed on the at least one second circuit board;

a plurality of accommodating members, being disposed in the second housing case, and correspondingly facing the plurality of first front openings;

a plurality of first mounting brackets, wherein each of the plurality of first mounting brackets has a first front plate;

wherein a storage device is able to be fixed on one of the plurality of first mounting brackets, and a first electrical connection interface of the storage device being connected to one of the plurality of electrical connectors after the first mounting bracket is inserted into one of the plurality of accommodating members through one of the plurality of first front openings;

wherein after the first mounting bracket is disposed in the accommodating member, the first front opening facing the accommodating member being shielded by the first front plate of the first mounting bracket.

In one embodiment, the storage device is selected from a group consisting of hard disk drive (HDD), solid state drive (SSD) and flash drive.

In one embodiment, a third opening, a second front opening and a first rear opening are formed on a top surface, a front surface and a rear surface of the third housing case, respectively, and the second expansion electronic device further comprises:

at least one third circuit board, being disposed in the third housing case, wherein the plurality of third electronic components, the at least one fourth transmission interface and at least one fifth transmission interface are disposed on the at least one third circuit board;

a plurality of second electrical connectors disposed on the at least one third circuit board;

a plurality of expansion card modules, wherein each of the plurality of expansion card modules comprises:

a printed circuit board disposed with a second electrical connection interface and at least one electronic module thereon; and a bracket, connected to a side edge of the printed circuit board, and comprising a first fixing portion and an inserting portion;

a rear plate, being connected to the third housing case so as to shield the first rear opening;

a plurality of cooling fans, being disposed in the third housing case, and facing the rear plate; and a mounting assembly, being connected to the third housing case so as to shield the second front opening, and comprising a mounting frame having a plurality of third front openings, a plurality of second fixing portions formed on a top side of the mounting frame, and a plurality of slit openings formed on the mounting frame so as to be correspondingly adjacent the plurality of third front openings;

wherein the rear plate is provided with a plurality of first vent holes thereon;

wherein after one of the plurality of expansion card modules is disposed in the third housing case, the second electrical connection interface of the expansion card module being connected to one of the plurality of second electrical connectors, the inserting portion of the bracket of the expansion card module passing through one of the plurality of slit openings of the mounting frame, such that one of the plurality of third front openings is shielded by the bracket;

wherein a fastening member is adopted for fastening the first fixing portion of the bracket on one of the plurality of second fixing portions of the mounting frame.

In one embodiment, a fourth opening, a plurality of fourth front openings and a plurality of second vent holes are formed on the second side surface, a front surface and a rear surface of the fourth housing case, respectively, and the third expansion electronic device further comprises:

at least one fourth circuit board, being disposed in the fourth housing case, wherein the plurality of fourth electronic components and at least one six transmission interface are disposed on the fourth circuit board;

a plurality of third electrical connectors disposed on the fourth circuit board; and a plurality of second mounting brackets;

wherein a power supply unit (PSU) is able to be fixed on one of the plurality of second mounting brackets, and a third electrical connection interface of the power supply unit being connected to one of the plurality of third electrical connectors after the second mounting brackets is inserted into the fourth housing case through one of the plurality of fourth front openings;

wherein the fourth front opening is shield by a second front plate of the second mounting bracket after the third electrical connection interface of the power supply unit is in connection with the third electrical connector;

wherein the second front plate is provided with a plurality of third vent holes and an eighth interface exposing opening, and a power inlet of the power supply unit being exposed out of the eighth interface exposing opening.

In one embodiment, at least one said power supply unit generates a power transmitted to at least one said third electrical connectors, and the fourth circuit board further transmits the power to the fifth transmission interface via the six transmission interface; continuously, the third circuit board transmits the power to the second transmission interface via the fourth transmission interface, and the first circuit board eventually transmits the power to the third transmission interface via the first transmission interface.

In one embodiment, the host electronic device utilizes the first transmission interface transmits at least one signal to the second transmission interface of the first expansion electronic device.

In one embodiment, the host electronic device utilizes the second transmission interface transmits at least one signal to the fourth transmission interface of the second expansion electronic device.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a modularized and expandable computer system according to the present invention, embodiments of the present invention will be described in detail with reference to the attached drawings hereinafter.

Figure 1:
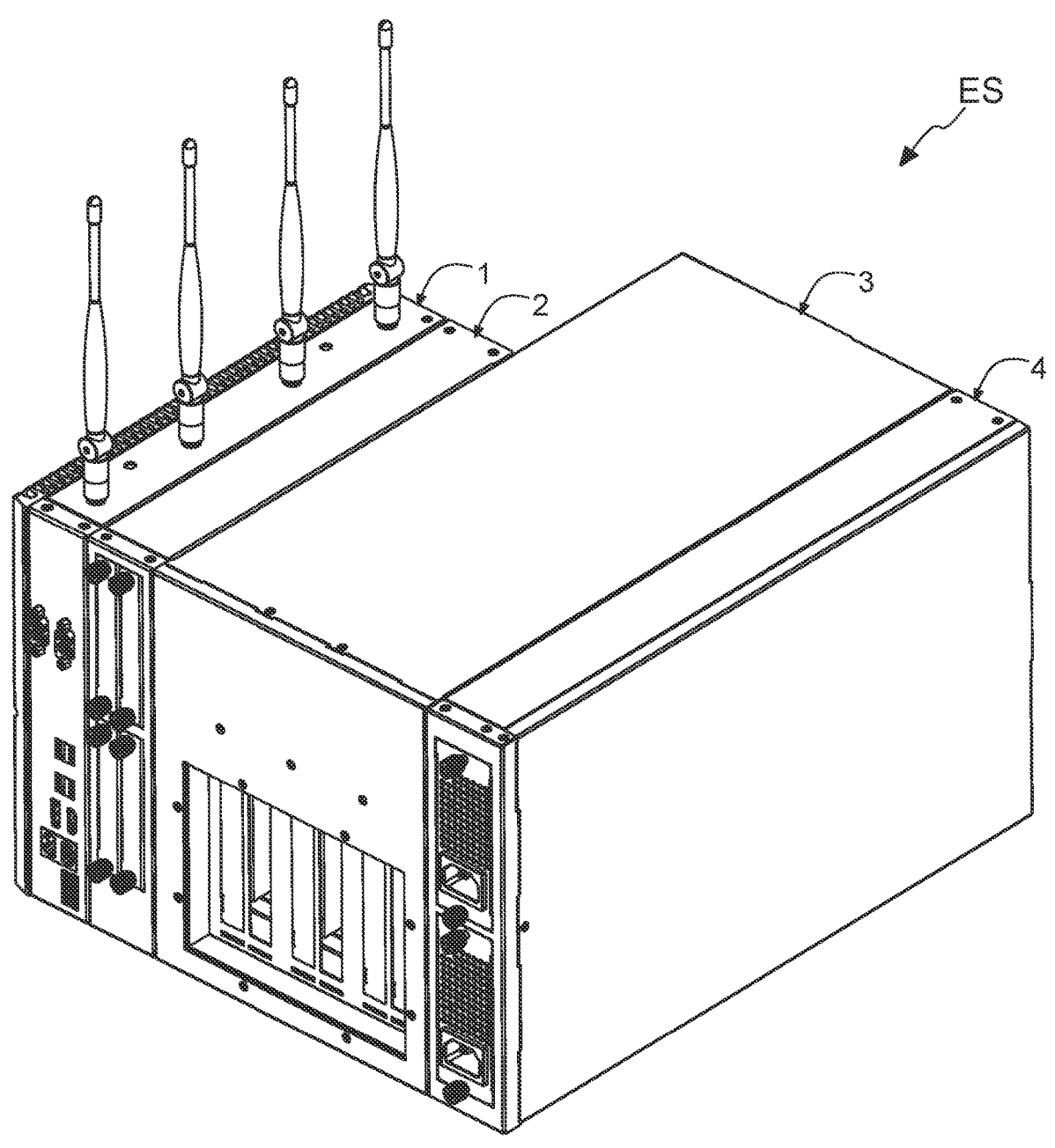
FIG. 1 is a stereo diagram of a modularized and expandable computer system according to the present invention.
Figure 2A:
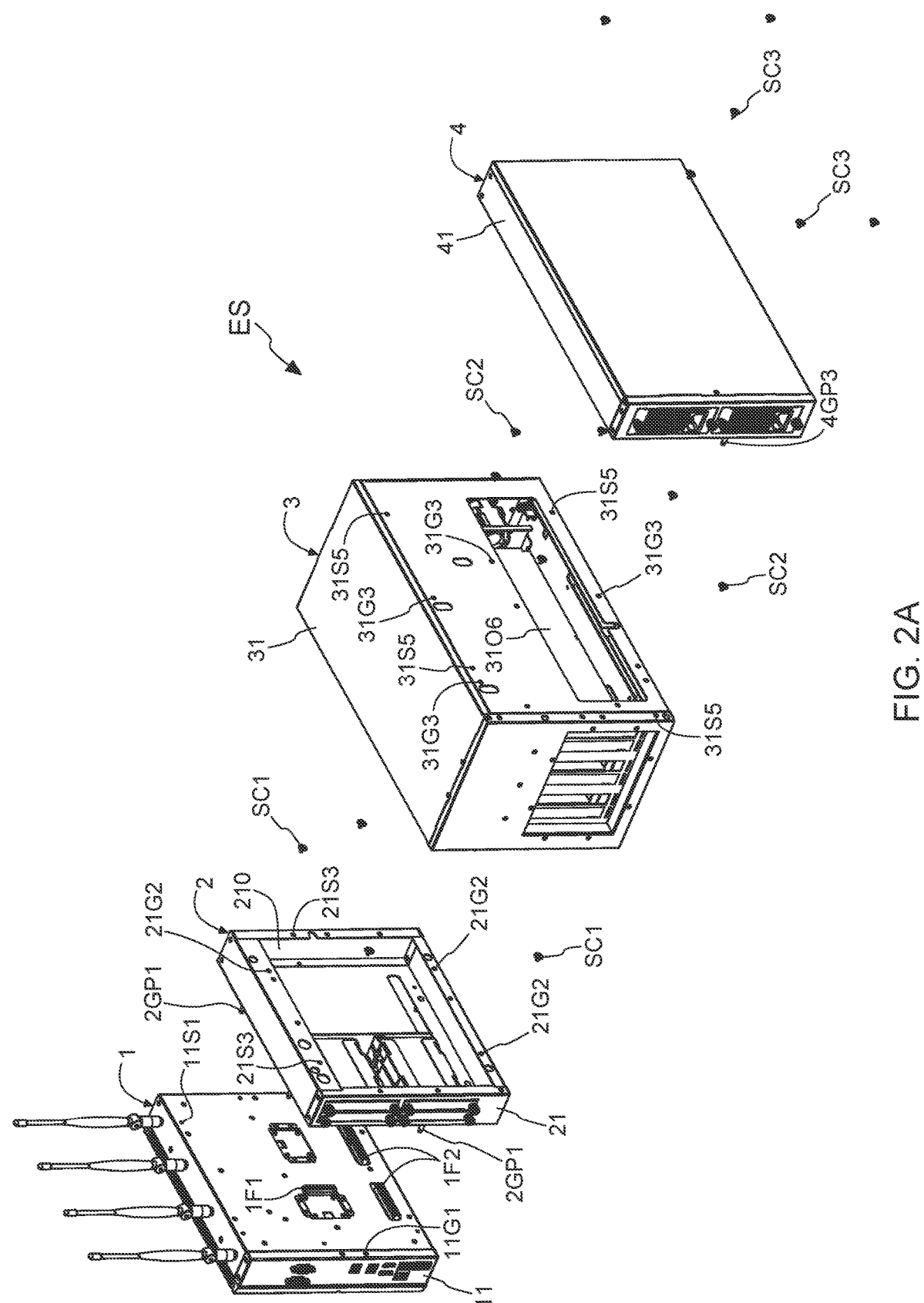
FIG. 2A is a first exploded view of the modularized and expandable computer system according to the present invention.
Figure 2B:
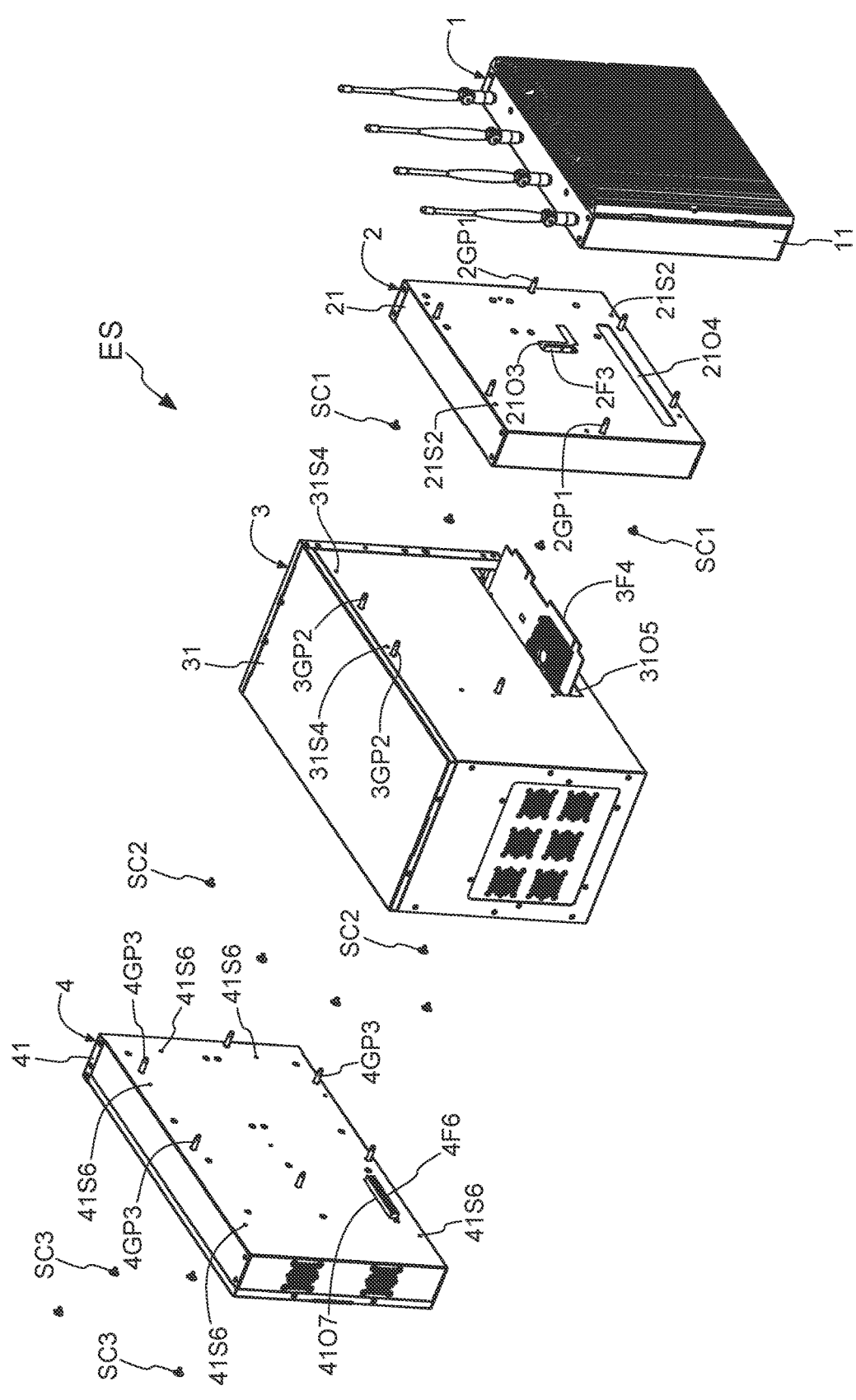
FIG. 2B is a second exploded view of the modularized and expandable computer system according to the present invention.

With reference to FIG. 1, there is illustrated a stereo diagram of a modularized and expandable computer system ES according to the present invention. Moreover, FIG. 2A and FIG. 2B show a first exploded view and a second exploded view of the modularized and expandable computer system ES. According to FIG. 1, FIG. 2A and FIG. 2B, the present invention discloses a modularized and expandable computer system ES comprising a host electronic device 1, a first expansion electronic device 2, a second expansion electronic device 3, and a third expansion electronic device 4. Specifically, in the present invention, a plurality of first guiding rods 2GP1 and a plurality of first fastening members SC1 are utilized to make a bottom surface of the first expansion electronic device 2 closely contact a bottom surface of the host electronic device 1, a plurality of second guiding rods 3GP2 and a plurality of second fastening members SC2 are utilized to make a first side surface of the second expansion electronic device 3 closely contact a top surface of the first expansion electronic device 2, and a plurality of third guiding rods 4GP3 and a plurality of third fastening members SC3 are utilized to make one side surface of the third expansion electronic device 4 closely contact a second side surface of the second expansion electronic device 3.

Figure 3A:
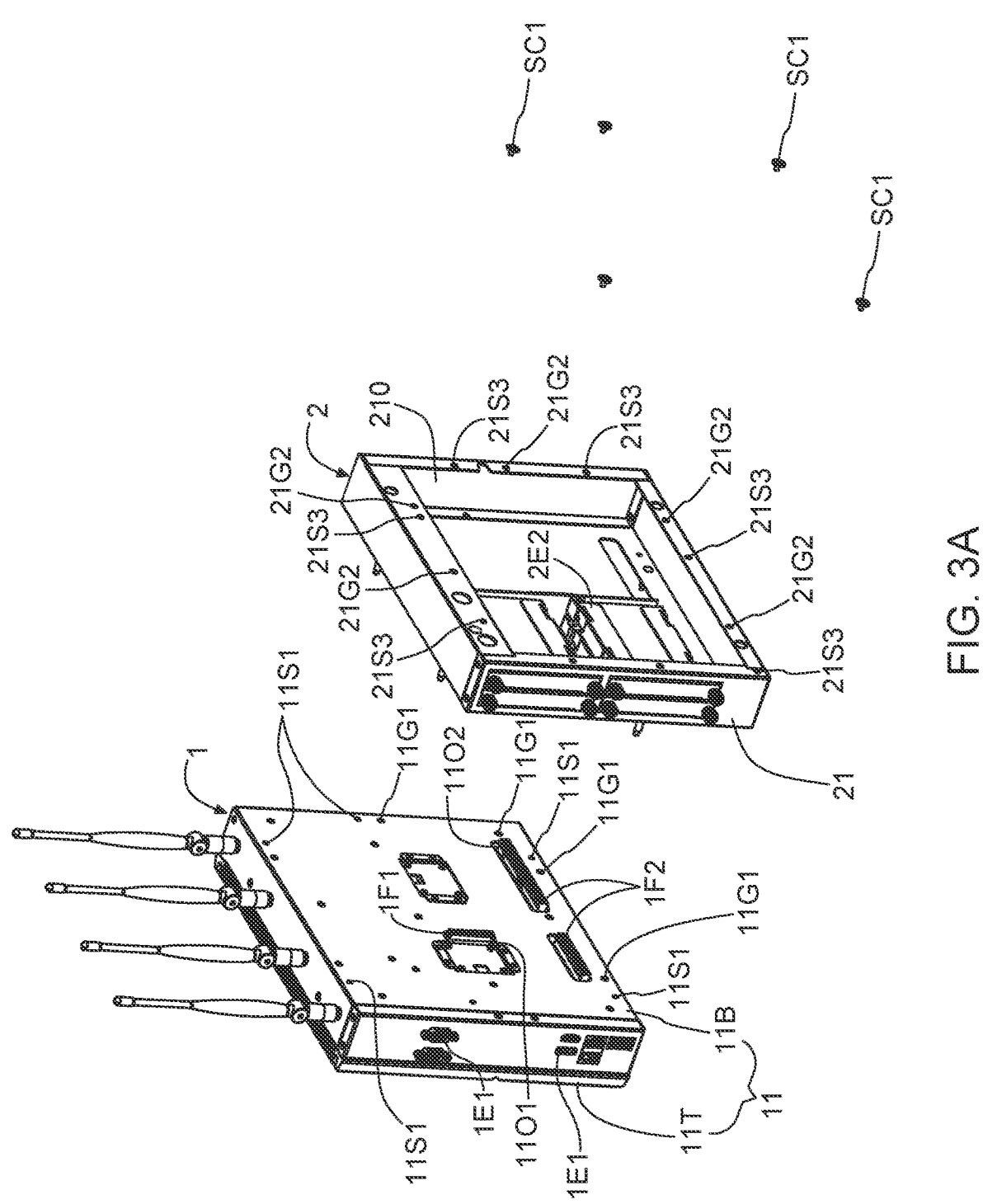
FIG. 3A is a first stereo diagram of a host electronic device and a first expansion electronic device as shown in FIG. 1.
Figure 3B:
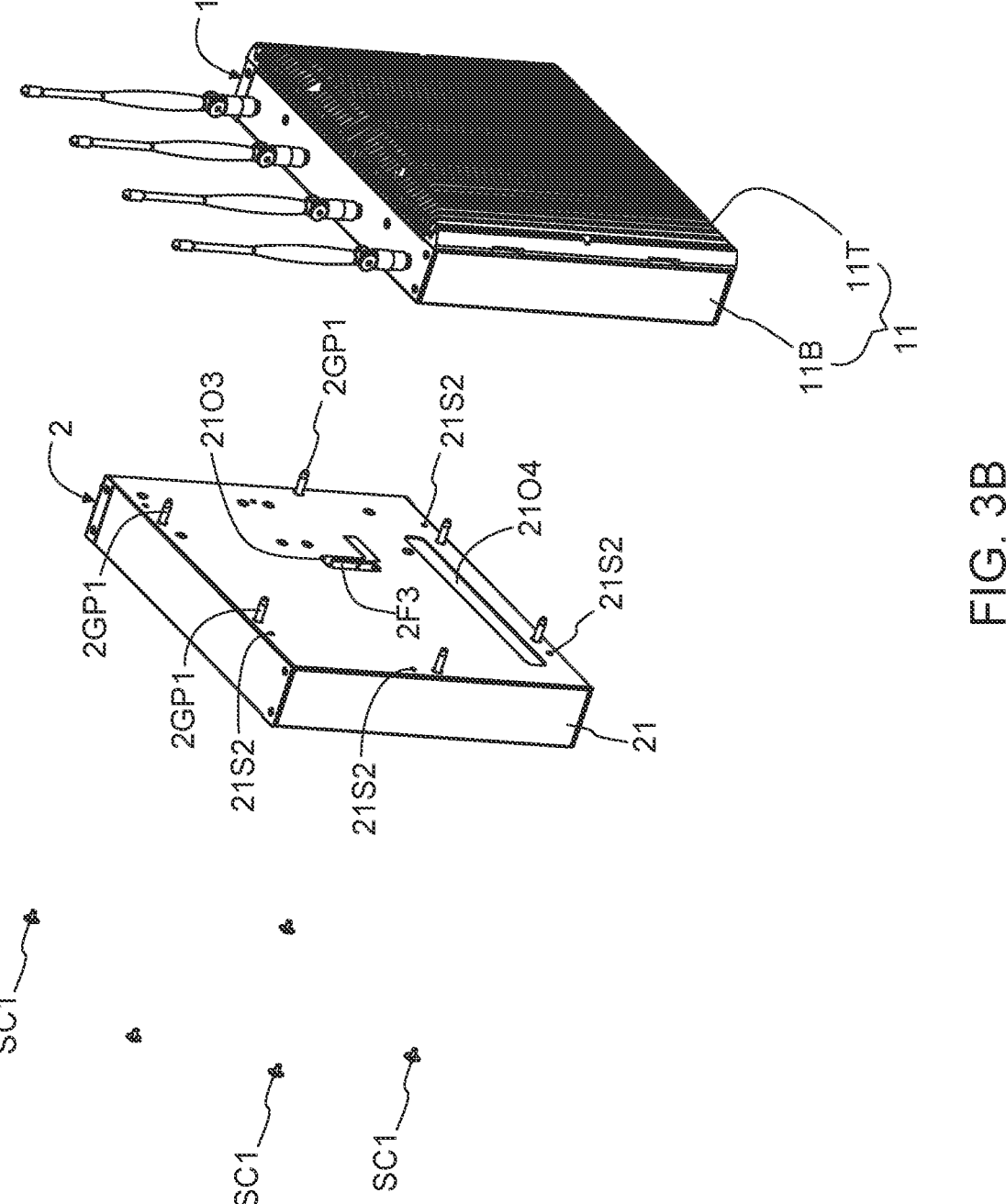
FIG. 3B is a second stereo diagram of the host electronic device and the first expansion electronic device.
Figure 4A:
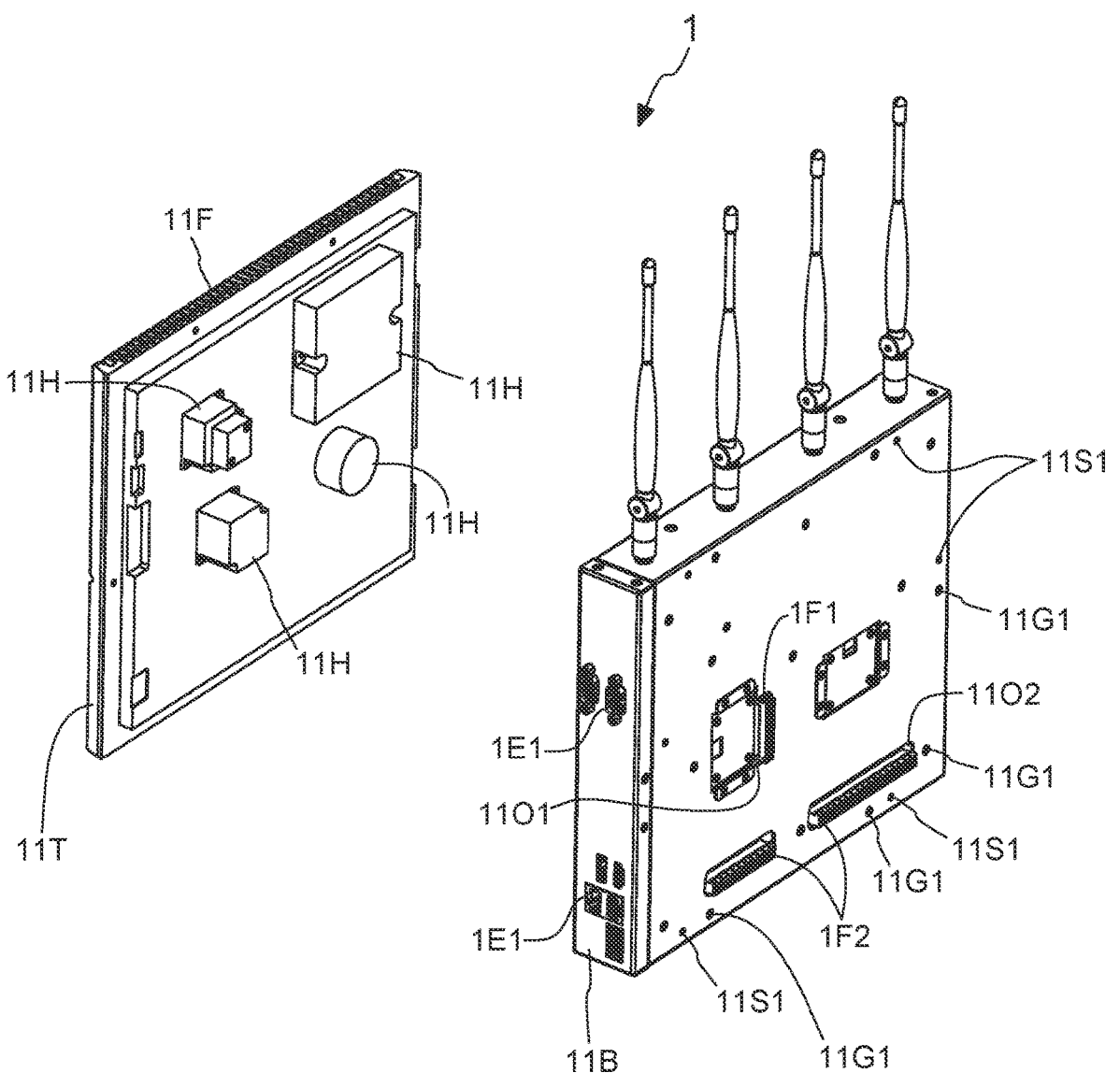
FIG. 4A is a first exploded view of the host electronic device.
Figure 4B:
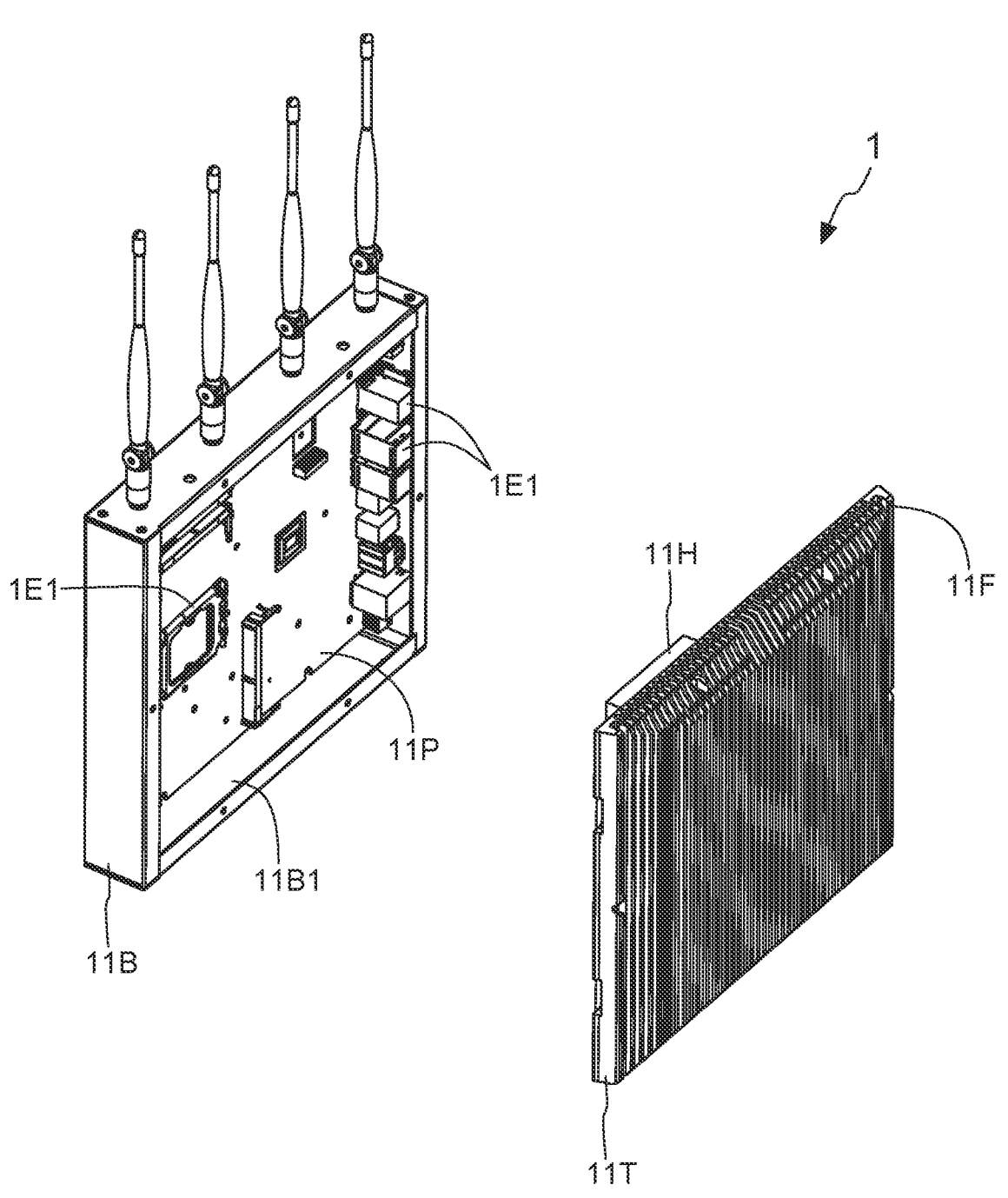
FIG. 4B is a second exploded view of the host electronic device.

FIG. 3A is a first stereo diagram of the host electronic device 1 and the first expansion electronic device 2 as shown in FIG. 1, and FIG. 3B is a second stereo diagram of the host electronic device 1 and the first expansion electronic device 2. Moreover, FIG. 4A and FIG. 4B show a first exploded view and a second exploded view of the host electronic device 1. According to the present invention, the host electronic device 1 comprises: a first housing case 11 consisting of a first base 11B and a first cover member 11T that is provided with a heat dissipation structure 11) on a top surface thereof, at least one first circuit board 11P accommodated in the first housing case 11, a plurality of first electronic components 1E1, at least one first transmission interface 1F1, at least one second transmission interface 1F2, at least one electronic chip (not shown), and at least one thermal dissipation block 11H, in which the plurality of first electronic components 1E1, the at least one first transmission interface 1F1, the at least one second transmission interface 1F2, the at least one electronic chip, the first transmission interface 1F1, and the second transmission interface 1F2 are disposed on the first circuit board 11P, and the at least one thermal dissipation block 11H is connected between a bottom surface of the first cover member 11T and the at least one electronic chip. Moreover, the at least one electronic chip disposed on the first circuit board 11P so as to be electrically connecting to the at least one first transmission interface 1F1 and the at least one second transmission interface 1F2.

As described in more detail below, the first base 11B has a first opening 11B1, and a bottom surface of the first housing case 11 (i.e., the bottom surface of the first base 11B) are formed with a plurality of first guiding holes 11G1 and a plurality of first screw holes 11S1 thereon. Moreover, according to FIG. 2A, FIG. 2B, FIG. 3A, FIG. 3B, FIG. 4A, and FIG. 4B, at least one first interface exposing opening 1101 is formed on the bottom surface of the first housing case 11 such that the at least one first transmission interface 1F1 is exposed out of the first housing case 11 through the at least one first interface exposing opening 1101. On the other hand, there is at least one second interface exposing opening 1102 formed on the bottom surface of the first housing case 11 such that the at least one second transmission interface 1F2 is exposed out of the first housing case 11 through the at least one second interface exposing opening 1102.

Figure 5A:
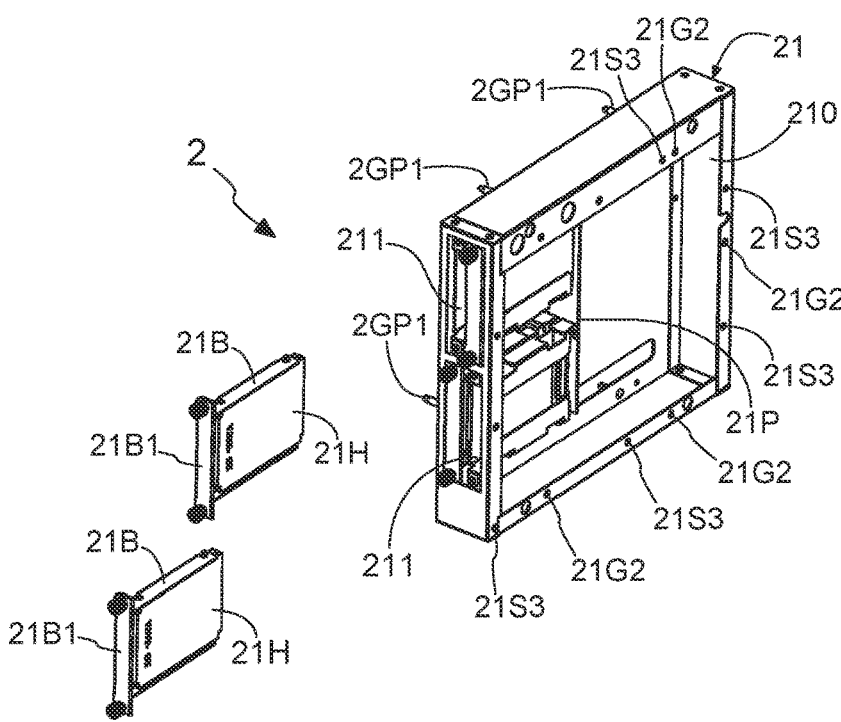
FIG. 5A is a first exploded view of the first expansion electronic device.
Figure 5B:
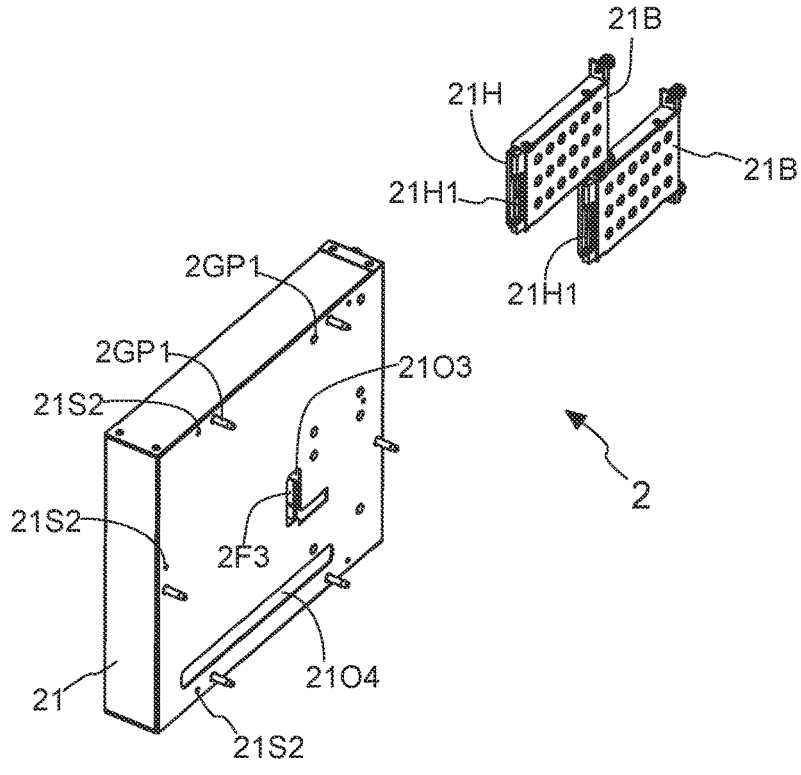
FIG. 5B is a second exploded view of the first expansion electronic device.
Figure 5C:
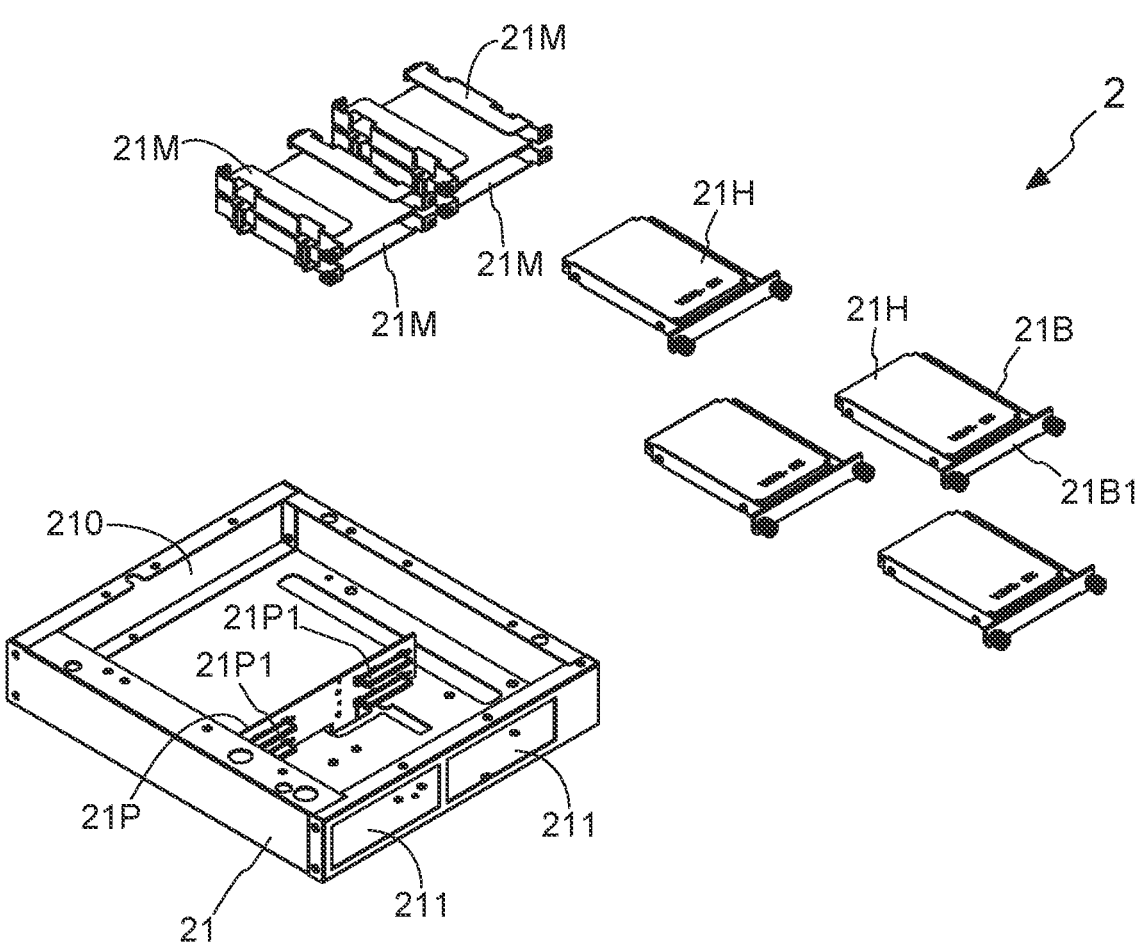
FIG. 5C is a third exploded view of the first expansion electronic device.

Referring to FIG. 2A, FIG. 2B, FIG. 3A, FIG. 3B, FIG. 4A, and FIG. 4B again, and please simultaneously refer to FIG. 5A, FIG. 5B and FIG. 5C showing a first exploded view, a second exploded view and a third exploded view of the first expansion electronic device 2. According to the present invention, the first expansion electronic device 2 comprises a second housing case 21, at least one second circuit board 21P, a plurality of first electrical connectors 21P1, a plurality of accommodating members 21M, and a plurality of first mounting brackets 21B, in which the at least one second circuit board 21P and the plurality of first mounting brackets 21B are disposed in the second housing case 21, the plurality of first electrical connectors 21P1 are disposed on the at least one second circuit board 21P, and there are second electronic components 2E2 and at least one third transmission interface 2F3 further disposed on the at least one second circuit board 21P. Moreover, a plurality of first guiding rods 2GP1 is disposed on a bottom surface of the second housing case 21, so as to be correspondingly inserted in the plurality of first guiding holes 11G1 while the bottom surface of the second housing case 21 is close to the bottom surface of the first housing case 11.

As described in more detail below, the bottom surface of the second housing case 21 are further provided with a plurality of second screw holes 21S2, and at least one third interface exposing opening 2103 and at least one fourth interface exposing opening 2104 thereon, such that the bottom surface of the second housing case 21 closely contacts the bottom surface of the first housing case 11 after a plurality of first fastening members SC1 are arranged to pass through the plurality of second screw holes 21S2 and the plurality of first screw holes 11S1. Moreover, it is worth noting that the at least one third transmission interface 1F3 is exposed out of the second housing case 21 through the at least one third interface exposing opening 2102 so as to be connected to the at least one first transmission interface 1F1 of the host electronic device 1. Furthermore, a top surface of the second housing case 21 is formed with a plurality of third screw holes 21S3, a plurality of second guiding holes 21G2 and a second opening 210 thereon, and a plurality of first front openings 211 is formed on a front side surface of the second housing case 21. In addition, the plurality of accommodating members 21M are disposed in the second housing case 21 so as to face the plurality of first front openings 211, and each of the plurality of first mounting brackets 21B has a first front plate 21B1.

According to the present invention, a storage device 21H is able to be fixed on one of the plurality of first mounting brackets 21B, and a first electrical connection interface 21H1 of the storage device (2H) is connected to one of the plurality of electrical connectors 21P1 after the first mounting bracket 21B is inserted into one of the plurality of accommodating members 21M through one of the plurality of first front openings 211. In a practicable embodiment, the storage device 21H can be, but is not limited to, a hard disk drive (HDD), a solid state drive (SSD) and a flash drive. Moreover, after the first mounting bracket 21B is disposed in the accommodating member 21M, the first front opening 211 facing the accommodating member 21M is shielded by the first front plate 21B1 of the first mounting bracket 21B.

Figure 6A:
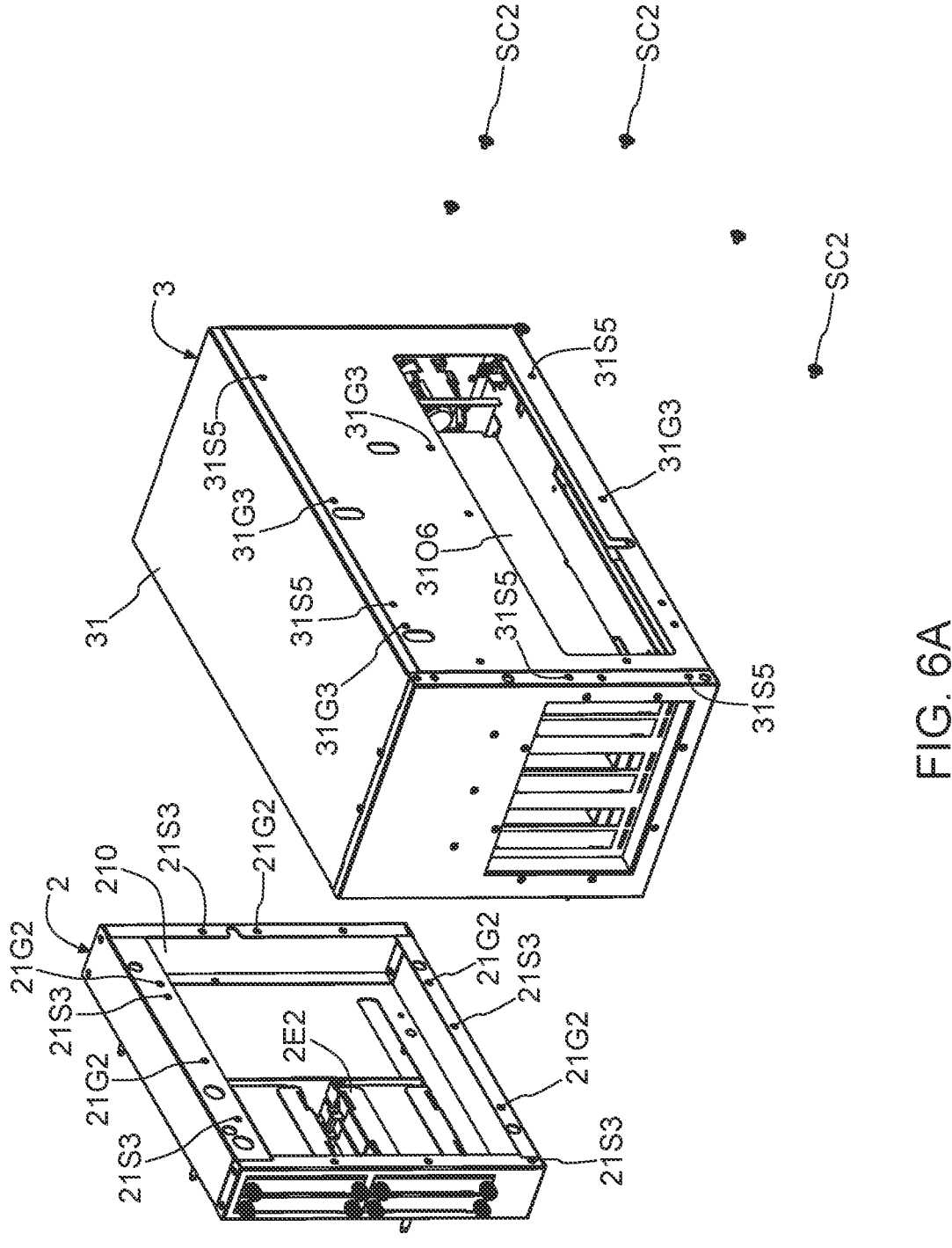
FIG. 6A is a first stereo diagram of the first expansion electronic device and a second expansion electronic device as shown in FIG. 1.
Figure 6B:
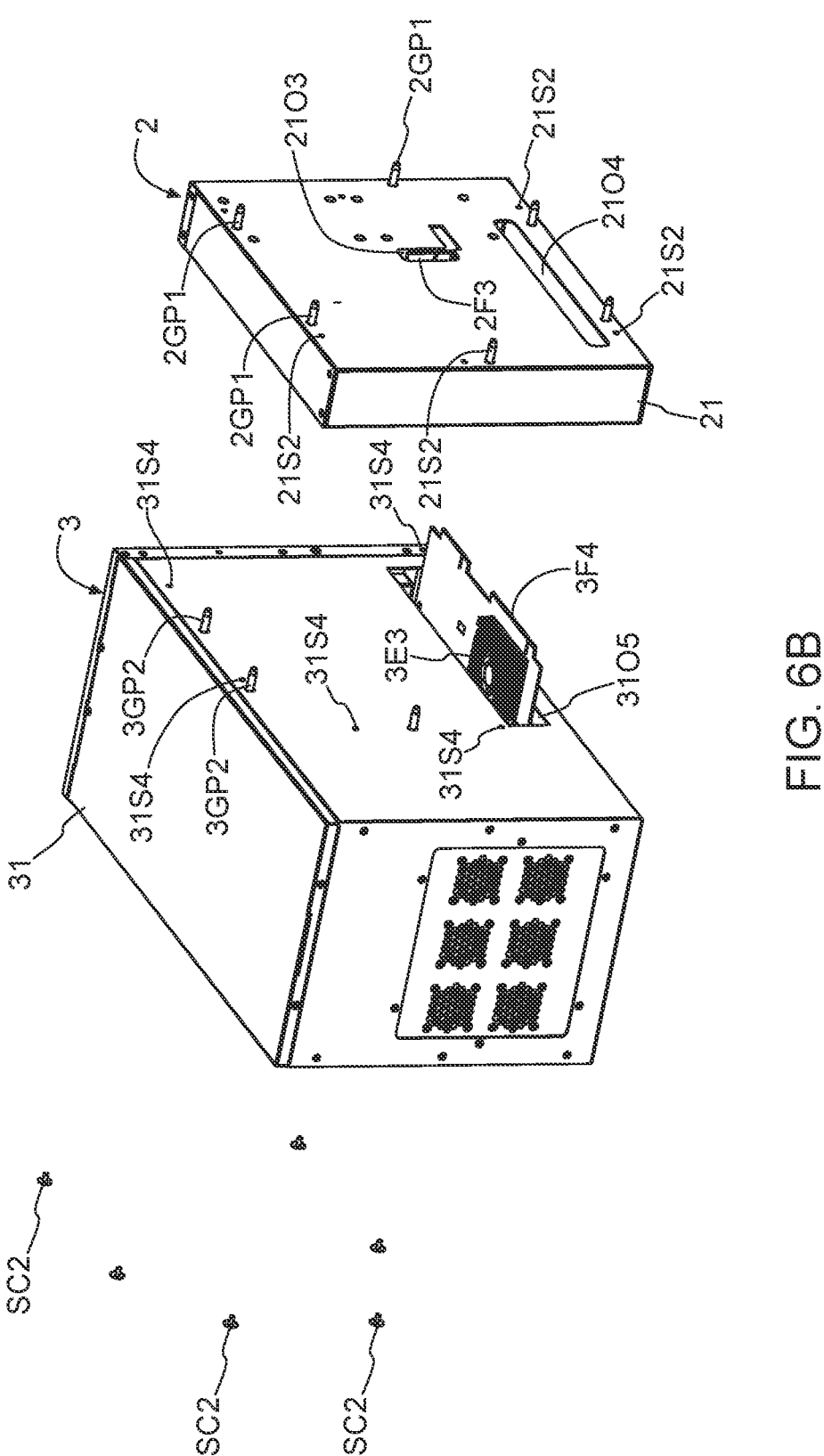
FIG. 6B is a second stereo diagram of the first expansion electronic device and the second expansion electronic device.
Figure 7A:
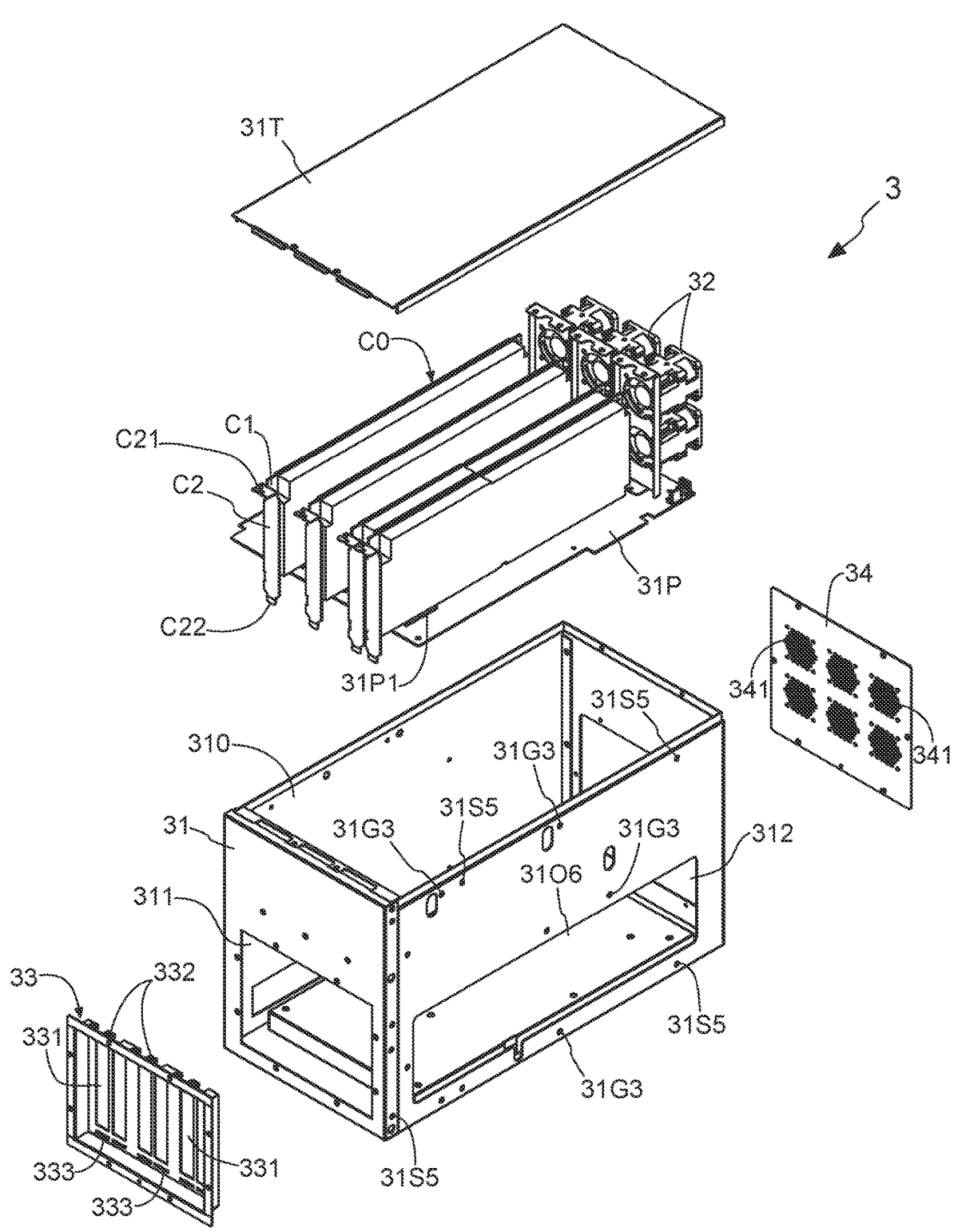
FIG. 7A is a first stereo diagram of the second expansion electronic device.
Figure 7B:
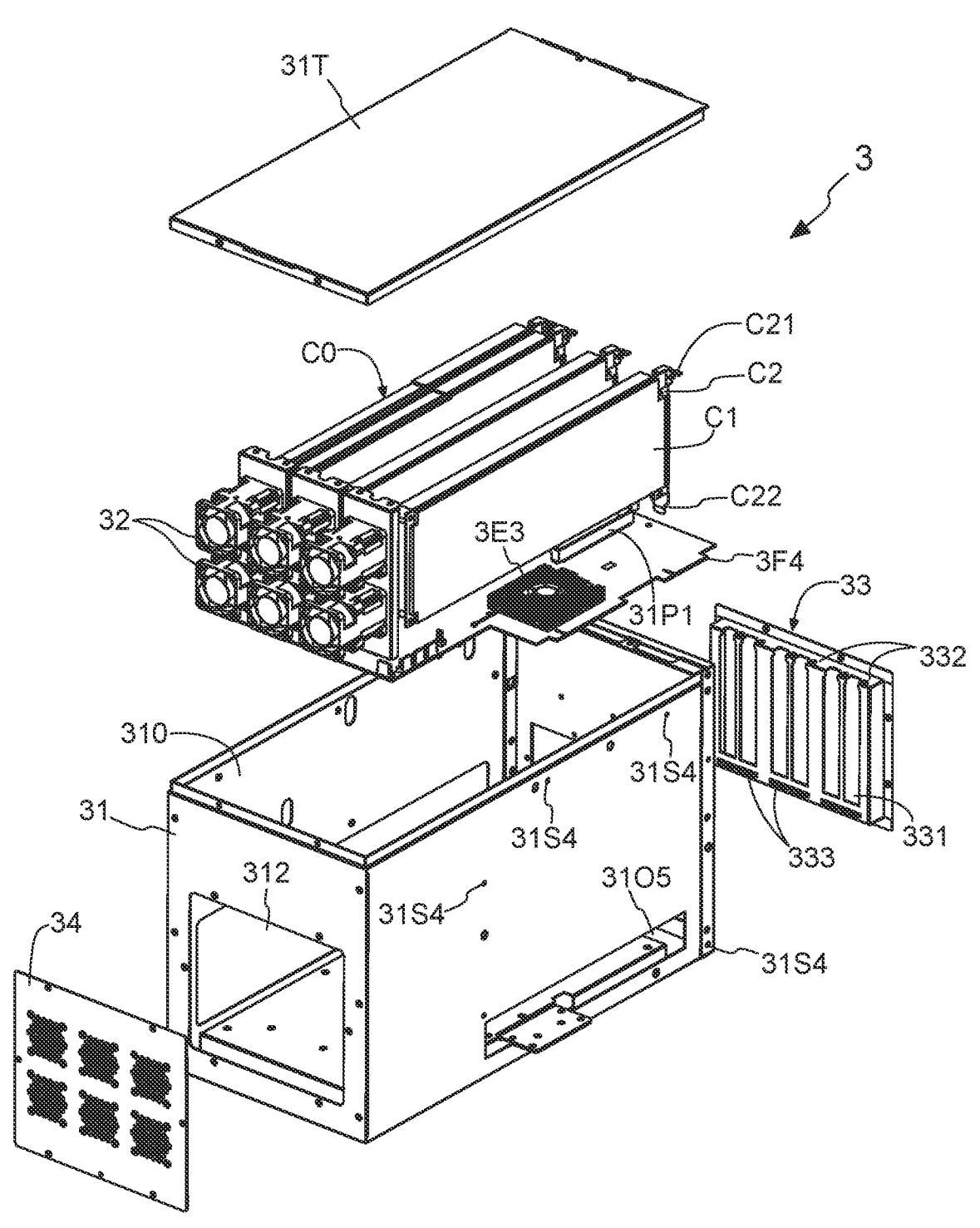
FIG. 7B is a second stereo diagram of the second expansion electronic device.

Referring to FIG. 2A and FIG. 2B again, and please simultaneously refer to FIG. 6A and FIG. 6B showing a first stereo diagram and a second stereo diagram of the first expansion electronic device 2 and the second expansion electronic device 3 as shown in FIG. 1. Moreover, FIG. 7A and FIG. 7B illustrate a first stereo diagram and a second stereo diagram of the second expansion electronic device 3. According to FIG. 2A, FIG. 2B, FIG. 6A, FIG. 6B, FIG. 7A, and FIG. 7B, the second expansion electronic device 3 comprises a third housing case 31, a plurality of second guiding rods 3GP2, a plurality of third electronic components 3E3, at least one fourth transmission interface 3F4 and at least one fifth transmission interface, at least one third circuit board 31P, a plurality of second electrical connectors 31P1, a plurality of expansion card modules C0, a rear plate 34 provided with a plurality of first vent holes 341 thereon, a plurality of cooling fans 32, and a mounting assembly. Particularly, the plurality of second guiding rods 3GP2 are formed on a first side surface of the third housing case 31, so as to be correspondingly inserted in the plurality of second guiding holes 21G2 while the first side surface of the third housing case 31 is close to the top surface of the second housing case 21. a plurality of fourth screw holes 31S2 are formed on the first side surface of the third housing case 31, wherein the first side surface of the third housing case 31 closely contacts the top surface of the second housing case 21 after a plurality of second fastening members SC2 are arranged to pass through the plurality of fourth screw holes 31S4 and the plurality of third screw holes 21S3.

FIG. 6A, FIG. 6B, FIG. 7A, and FIG. 7B further depict that at least one fifth interface exposing opening 3105 is formed on the first side surface of the third housing case 31 such that the at least one fourth transmission interface 3F4 is exposed out of the third housing case 31 through the at least one fifth interface exposing opening 3105 so as to be connected to the at least one second transmission interface 1F2 via the at least one fourth interface exposing opening 2104 of the second housing case 21. In addition, at least one sixth interface exposing opening 3106, a plurality of fifth screw holes 31S5 and a plurality of third guiding holes 31G3 are formed on a second side surface of the third housing case 31, wherein the second side surface is opposite to the first side surface. On the other hand, it is worth noting that a third opening 310, a second front opening 311 and a first rear opening 312 are formed on a top surface, a front surface and a rear surface of the third housing case 31, respectively.

As described in more detail below, the at least one third circuit board 31P is disposed in the third housing case 31, and the plurality of third electronic components 3E3, the at least one fourth transmission interface 3F4, the at least one fifth transmission interface, and the plurality of second electrical connectors 31P1 are disposed on the at least one third circuit board 31P. As FIG. 6A, FIG. 6B, FIG. 7A, and FIG. 7B show, each of the plurality of expansion card modules C0 comprises a printed circuit board C1 and a bracket C2, wherein the printed circuit board C1 is disposed with a second electrical connection interface and at least one electronic module (e.g., GUP module) thereon, and the bracket C2 comprising a first fixing portion C21 and an inserting portion C22 is connected to a side edge of the printed circuit board C1. Moreover, the rear plate 31 is connected to the third housing case 31 so as to shield the first rear opening 312, and the plurality of cooling fans 32 are disposed in the third housing case 31 so as to face the rear plate 31. On the other hand, according to the present invention the mounting assembly is connected to the third housing case 31 so as to shield the second front opening 311, and is particularly designed to comprise a mounting frame 33 having a plurality of third front openings 331, a plurality of second fixing portions 332 formed on a top side of the mounting frame 33, and a plurality of slit openings 333 formed on the mounting frame 33 so as to be correspondingly adjacent the plurality of third front openings 331.

According to FIG. 6A, FIG. 6B, FIG. 7A, and FIG. 7B, after one of the plurality of expansion card modules C0 is disposed in the third housing case 31, the second electrical connection interface of the expansion card module C0 is connected to one of the plurality of second electrical connectors 31P1, the inserting portion C22 of the bracket C2 of the expansion card module C0 pass through one of the plurality of slit openings 333 of the mounting frame 33, such that one of the plurality of third front openings 331 is shielded by the bracket C2. Furthermore, a fastening member is adopted for fastening the first fixing portion C21 of the bracket C2 on one of the plurality of second fixing portions 332 of the mounting frame 33.

Figure 8A:
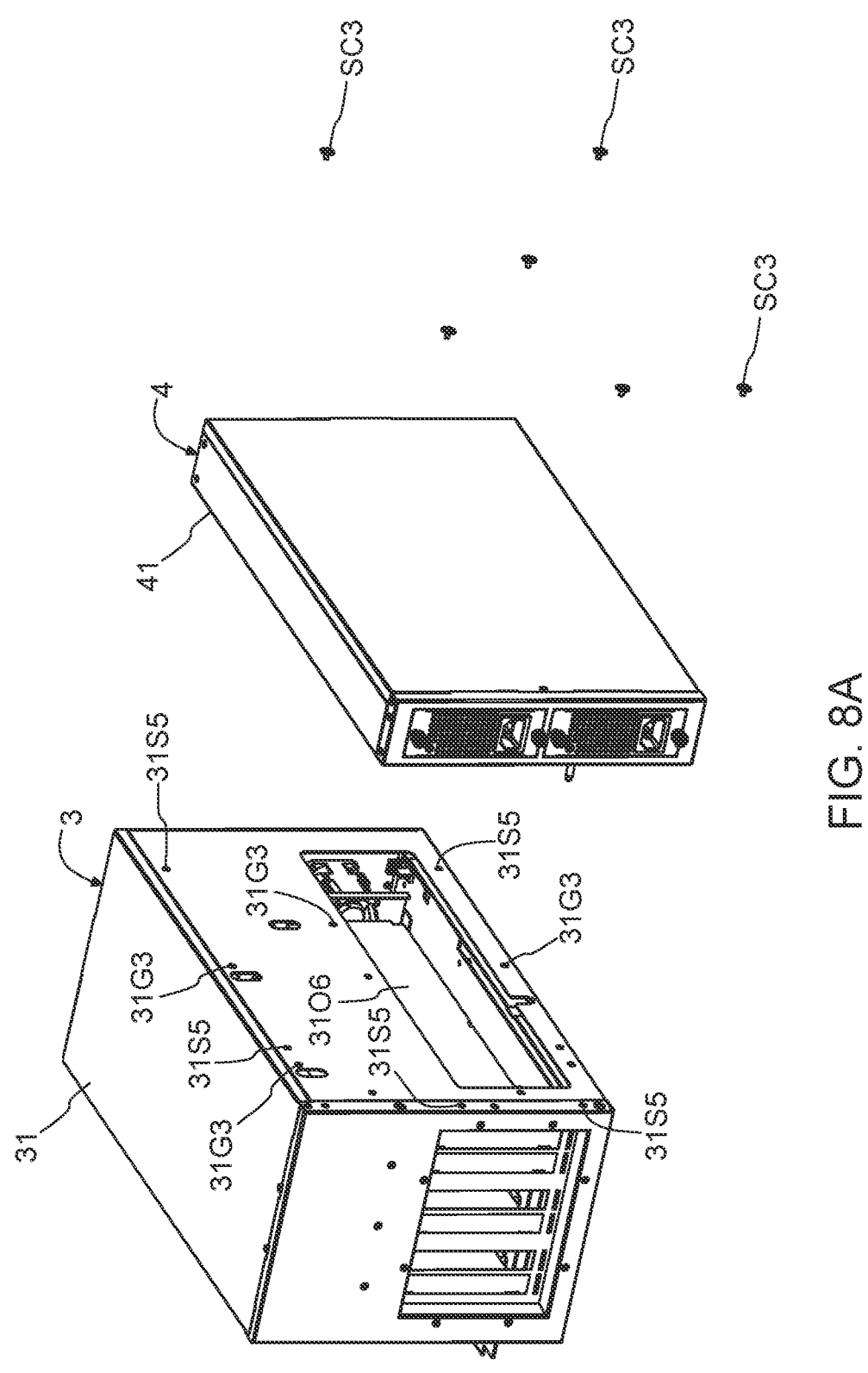
FIG. 8A is a first stereo diagram of the second expansion electronic device and a third expansion electronic device as shown in FIG. 1.
Figure 8B:
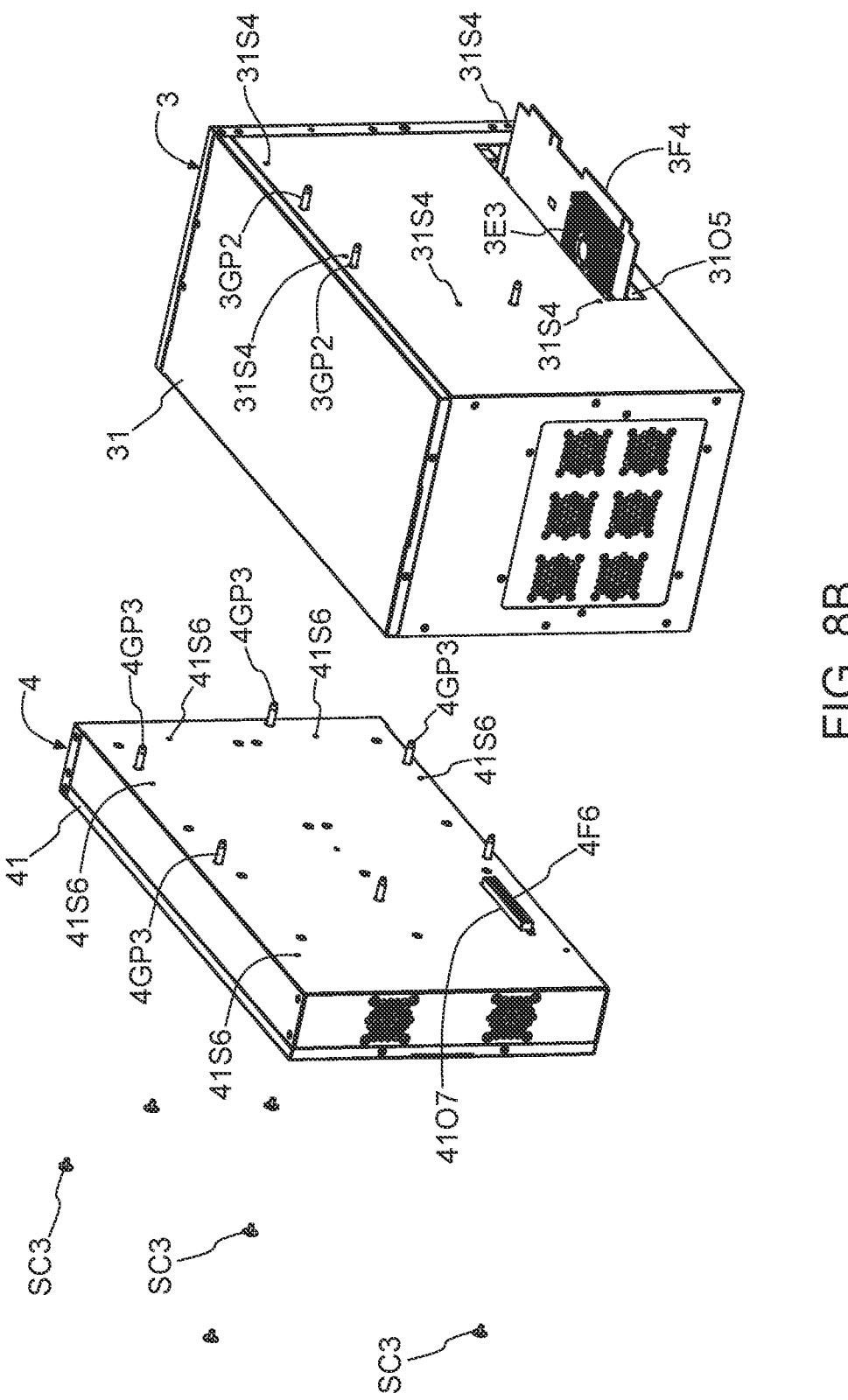
FIG. 8B is a second stereo diagram of the second expansion electronic device and the third expansion electronic device.
Figure 9:
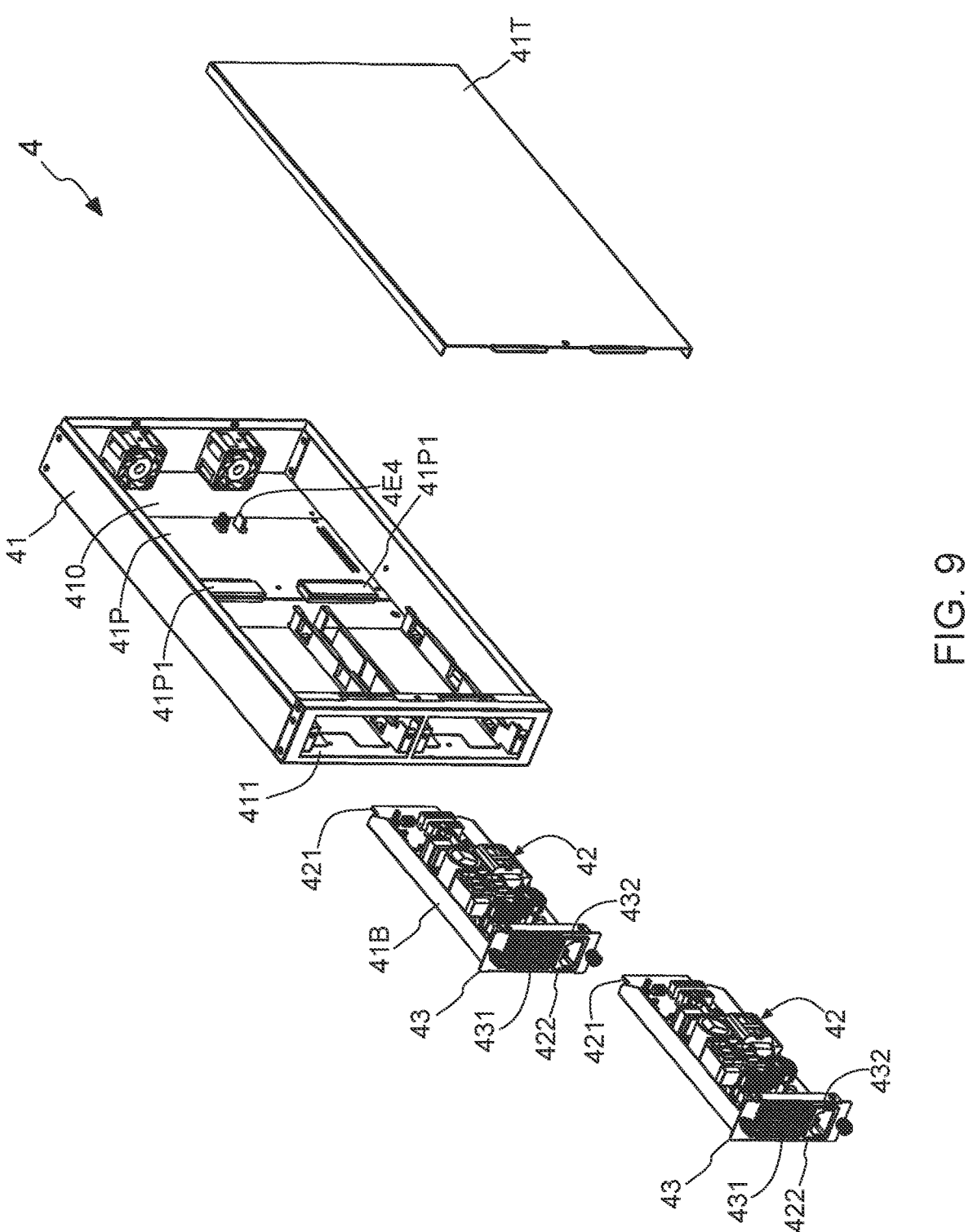
FIG. 9 is an exploded view of the third expansion electronic device.

Referring to FIG. 2A and FIG. 2B again, and please simultaneously refer to FIG. 8A and FIG. 8B showing a first stereo diagram and a second stereo diagram of the second expansion electronic device 3 and the third expansion electronic device 4 as shown in FIG. 1. Moreover, FIG. 9 is an exploded view of the third expansion electronic device 4. According to the present invention, the third expansion electronic device 4 comprises a fourth housing case 41, a plurality of fourth electronic components 4E4, at least one six transmission interface 4F6, a plurality of third guiding rods 4GP3, at least one fourth circuit board 41P, a plurality of third electrical connectors 41P1, and a plurality of second mounting brackets 41B, in which the at least one fourth circuit board 41P and plurality of second mounting brackets 41B are disposed in the fourth housing case 41, and the plurality of fourth electronic components 4E4, the at least one six transmission interface 4F6, and the plurality of third electrical connectors 41P1 are disposed on the fourth circuit board 41P.

As FIG. 8A, FIG. 8B and FIG. 9 show, the plurality of third guiding rods 4GP3 are disposed on one side surface of the fourth housing case 41, so as to be correspondingly inserted in the plurality of third guiding holes 31G3 while the second side surface of the third housing case 31 is close to the side surface of the fourth housing case 41. Moreover, the plurality of sixth screw holes 41S6 are formed on the side surface of the fourth housing case 41, wherein the second side surface of the third housing case 31 closely contacts the side surface of the fourth housing case 41 after a plurality of third fastening SC3 members are arranged to pass through the plurality of sixth screw holes 41S6 and the plurality of fifth screw holes 31S5. On the other hand, it is worth noting that at least one seventh interface exposing opening 4107 is formed on the side surface of the fourth housing case 41, and a fourth opening 410, a plurality of fourth front openings 411 and a plurality of second vent holes are formed on the second side surface, a front surface and a rear surface of the fourth housing case 41, respectively. By such designs, the at least one sixth transmission interface 4F6 is exposed out of the fourth housing case 41 through the at least one seventh interface exposing opening 4107 so as to be connected to the at least one fifth transmission interface via the at least one six interface exposing opening 3106 of the third housing case 31.

According to the present invention, a power supply unit (PSU) 42 is able to be fixed on one of the plurality of second mounting brackets 41B, and a third electrical connection interface 421 of the power supply unit 42 is connected to one of the plurality of third electrical connectors 41P1 after the second mounting brackets 41B is inserted into the fourth housing case 41 through one of the plurality of fourth front openings 411. Therefore, the fourth front opening 411 is shield by a second front plate 43 of the second mounting bracket 41B after the third electrical connection interface 421 of the power supply unit 42 is in connection with the third electrical connector 41P1. In addition, the second front plate 43 is provided with a plurality of third vent holes 431 and an eighth interface exposing opening 4308, and a power inlet 422 of the power supply unit 42 is exposed out of the eighth interface exposing opening 4308.

Therefore, above descriptions have introduced all embodiments and their constituting elements of the modularized and expandable computer system ES according to the present invention. In this modularized and expandable computer system ES, at least one said power supply unit 42 generates a power transmitted to at least one said third electrical connectors 41P1, and the fourth circuit board 41P further transmits the power to the fifth transmission interface via the six transmission interface 4F6; continuously, the third circuit board 31P transmits the power to the second transmission interface 1F2 via the fourth transmission interface 3F4, and the first circuit board 11P eventually transmitting the power to the third transmission interface 2F3 via the first transmission interface 1F1. On the other hand, in this modularized and expandable computer system ES the host electronic device 1 utilizes the first transmission interface 1F1 transmits at least one signal to the second transmission interface 2F3 of the first expansion electronic device 2, and utilizes the second transmission interface 1F2 transmits at least one signal to the fourth transmission interface 3F4 of the second expansion electronic device 3.

It is worth particularly mentioning that, it is allowable for a user to take measures of adding, removal or repair of storage modules (e.g., HDD or SSD) or electronic components to the first expansion electronic device 2. Moreover, the user can also take measures of adding, removal or repair of expansion card modules (e.g., GPU card or QNAP Fibre Channel Expansion Card) or electronic components to the second expansion electronic device 3. In addition, the user is also allowed to take measures of adding, removal or repair of power supply units (PSUs) or electronic components to the third expansion electronic device 4.

Therefore, through above descriptions, all embodiments and their constituting elements of the modularized and expandable computer system according to the present invention have been introduced completely and clearly. Moreover, the above description is made on embodiments of the present invention. However, the embodiments are not intended to limit the scope of the present invention, and all equivalent implementations or alterations within the spirit of the present invention still fall within the scope of the present invention.

What is claimed is:

1. A modularized and expandable computer system, comprising:

a host electronic device, comprising:

a first housing case accommodating a plurality of first electronic components, at least one first transmission interface and at least one second transmission interface;

a plurality of first guiding holes formed on a bottom surface of the first housing case;

a plurality of first screw holes formed on the bottom surface of the first housing case;

at least one first interface exposing opening, being formed on the bottom surface of the first housing case such that the at least one first transmission interface is exposed out of the first housing case through the at least one first interface exposing opening; and at least one second interface exposing opening, being formed on the bottom surface of the first housing case such that the at least one second transmission interface is exposed out of the first housing case through the at least one second interface exposing opening;

a first expansion electronic device, comprising:

a second housing case accommodating a plurality of second electronic components and at least one third transmission interface;

a plurality of first guiding rods, being disposed on a bottom surface of the second housing case, so as to be correspondingly inserted in the plurality of first guiding holes while the bottom surface of the second housing case is close to the bottom surface of the first housing case;

a plurality of second screw holes, being formed on the bottom surface of the second housing case, wherein the bottom surface of the second housing case closely contacts the bottom surface of the first housing case after a plurality of first fastening members are arranged to pass through the plurality of second screw holes and the plurality of first screw holes;

at least one third interface exposing opening, being formed on the bottom surface of the second housing case such that the at least one third transmission interface is exposed out of the second housing case through the at least one third interface exposing opening so as to be connected to the at least one first transmission interface;

at least one fourth interface exposing opening formed on the bottom surface of the second housing case;

a plurality of third screw holes formed on a top surface of the second housing case; and a plurality of second guiding holes formed on the top surface of the second housing case;

a second expansion electronic device, comprising:

a third housing case accommodating a plurality of third electronic components, at least one fourth transmission interface and at least one fifth transmission interface;

a plurality of second guiding rods, being formed on a first side surface of the third housing case, so as to be correspondingly inserted in the plurality of second guiding holes while the first side surface of the third housing case is close to the top surface of the second housing case;

a plurality of fourth screw holes, being formed on the first side surface of the third housing case, wherein the first side surface of the third housing case closely contacts the top surface of the second housing case after a plurality of second fastening members are arranged to pass through the plurality of fourth screw holes and the plurality of third screw holes;

at least one fifth interface exposing opening, being formed on the first side surface of the third housing case such that the at least one fourth transmission interface is exposed out of the third housing case through the at least one fifth interface exposing opening so as to be connected to the at least one second transmission interface via the at least one fourth interface exposing opening of the second housing case;

at least one sixth interface exposing opening, being formed on a second side surface of the third housing case, wherein the second side surface is opposite to the first side surface;

a plurality of fifth screw holes formed on the second side surface of the third housing case; and a plurality of third guiding holes formed on the second side surface of the third housing case; and a third expansion electronic device, comprising:

a fourth housing case accommodating a plurality of fourth electronic components and at least one six transmission interface;

a plurality of third guiding rods, being disposed on one side surface of the fourth housing case, so as to be correspondingly inserted in the plurality of third guiding holes while the second side surface of the third housing case is close to the side surface of the fourth housing case;

a plurality of sixth screw holes, being formed on the side surface of the fourth housing case, wherein the second side surface of the third housing case closely contacts the side surface of the fourth housing case after a plurality of third fastening members are arranged to pass through the plurality of sixth screw holes and the plurality of fifth screw holes; and at least one seventh interface exposing opening, being formed on the side surface of the fourth housing case such that the at least one sixth transmission interface is exposed out of the fourth housing case through the at least one seventh interface exposing opening so as to be connected to the at least one fifth transmission interface via the at least one six interface exposing opening of the third housing case.

2. The modularized and expandable computer system of claim 1, wherein the host electronic device comprises:

a first base having a first opening, wherein the plurality of first guiding holes, the plurality of first screw holes, the at least one first interface exposing opening, and the second interface exposing opening are formed on a bottom of the first base;

a first cover member, being provided with a heat dissipation structure on a top surface thereof, and being connected to the first base so as to form the first housing case;

at least one first circuit board, being disposed in the first base through the first opening, wherein the plurality of first electronic components, the at least one first transmission interface and the at least one second transmission interface are disposed on the first circuit board;

at least one electronic chip, being disposed on the first circuit board, thereby being electrically connecting to the at least one first transmission interface and the at least one second transmission interface; and at least one thermal dissipation block connected between a bottom surface of the first cover member and the at least one electronic chip.

3. The modularized and expandable computer system of claim 1, wherein the top surface of the second housing case has a second opening, and a front side surface of the second housing case being formed with a plurality of first front openings thereon; the first expansion electronic device further comprising:

at least one second circuit board, being disposed in the second housing case, wherein the plurality of second electronic components and the at least one third transmission interface are disposed on the at least one second circuit board;

a plurality of first electrical connectors disposed on the at least one second circuit board;

a plurality of accommodating members, being disposed in the second housing case, and correspondingly facing the plurality of first front openings; and a plurality of first mounting brackets, wherein each of the plurality of first mounting brackets has a first front plate;

wherein a storage device is able to be fixed on one of the plurality of first mounting brackets, and a first electrical connection interface of the storage device being connected to one of the plurality of electrical connectors after the first mounting bracket is inserted into one of the plurality of accommodating members through one of the plurality of first front openings;

wherein after the first mounting bracket is disposed in the accommodating member, the first front opening facing the accommodating member being shielded by the first front plate of the first mounting bracket.

4. The modularized and expandable computer system of claim 3, wherein the storage device is selected from a group consisting of hard disk drive (HDD), solid state drive (SSD) and flash drive.

5. The modularized and expandable computer system of claim 3, wherein a third opening, a second front opening and a first rear opening are formed on a top surface, a front surface and a rear surface of the third housing case, respectively, and the second expansion electronic device further comprising:

at least one third circuit board, being disposed in the third housing case, wherein the plurality of third electronic components, the at least one fourth transmission interface and at least one fifth transmission interface are disposed on the at least one third circuit board;

a plurality of second electrical connectors disposed on the at least one third circuit board;

a plurality of expansion card modules, wherein each of the plurality of expansion card modules comprises:

a printed circuit board disposed with a second electrical connection interface and at least one electronic module thereon; and a bracket, connected to a side edge of the printed circuit board, and comprising a first fixing portion and an inserting portion;

a rear plate, being connected to the third housing case so as to shield the first rear opening;

a plurality of cooling fans, being disposed in the third housing case, and facing the rear plate; and a mounting assembly, being connected to the third housing case so as to shield the second front opening, and comprising a mounting frame having a plurality of third front openings, a plurality of second fixing portions formed on a top side of the mounting frame, and a plurality of slit openings formed on the mounting frame so as to be correspondingly adjacent the plurality of third front openings;

wherein the rear plate is provided with a plurality of first vent holes thereon;

wherein after one of the plurality of expansion card modules is disposed in the third housing case, the second electrical connection interface of the expansion card module being connected to one of the plurality of second electrical connectors, the inserting portion of the bracket of the expansion card module passing through one of the plurality of slit openings of the mounting frame, such that one of the plurality of third front openings is shielded by the bracket;

wherein a fastening member is adopted for fastening the first fixing portion of the bracket on one of the plurality of second fixing portions of the mounting frame.

6. The modularized and expandable computer system of claim 5, wherein a fourth opening, a plurality of fourth front openings and a plurality of second vent holes are formed on the second side surface, a front surface and a rear surface of the fourth housing case, respectively, and the third expansion electronic device further comprising:

at least one fourth circuit board, being disposed in the fourth housing case, wherein the plurality of fourth electronic components and at least one six transmission interface are disposed on the fourth circuit board;

a plurality of third electrical connectors disposed on the fourth circuit board; and a plurality of second mounting brackets;

wherein a power supply unit (PSU) is able to be fixed on one of the plurality of second mounting brackets, and a third electrical connection interface of the power supply unit being connected to one of the plurality of third electrical connectors after the second mounting brackets is inserted into the fourth housing case through one of the plurality of fourth front openings;

wherein the fourth front opening is shield by a second front plate of the second mounting bracket after the third electrical connection interface of the power supply unit is in connection with the third electrical connector;

wherein the second front plate is provided with a plurality of third vent holes and an eighth interface exposing opening, and a power inlet of the power supply unit being exposed out of the eighth interface exposing opening.

7. The modularized and expandable computer system of claim 6, wherein at least one said power supply unit generates a power transmitted to at least one said third electrical connectors, and the fourth circuit board further transmitting the power to the fifth transmission interface via the six transmission interface; continuously, the third circuit board transmitting the power to the second transmission interface via the fourth transmission interface, and the first circuit board eventually transmitting the power to the third transmission interface via the first transmission interface.

8. The modularized and expandable computer system of claim 6, wherein the host electronic device utilizes the first transmission interface transmits at least one signal to the second transmission interface of the first expansion electronic device.

9. The modularized and expandable computer system of claim 6, wherein the host electronic device utilizes the second transmission interface transmits at least one signal to the fourth transmission interface of the second expansion electronic device.

* * * * *